United States Patent [19]
Sim et al.

[11] Patent Number: 6,134,115
[45] Date of Patent: Oct. 17, 2000

[54] APPARATUS FOR SECURING A REMOVABLE COMPONENT IN A COMPUTER SYSTEM

[75] Inventors: Vibora Sim, Pflugerville; Ty Robert Schmitt, Round Rock, both of Tex.

[73] Assignee: Dell USA, L.P., Round Rock, Tex.

[21] Appl. No.: 09/290,979

[22] Filed: Apr. 13, 1999

[51] Int. Cl.[7] .............................. H05K 7/00; H05K 5/00; H05K 7/16
[52] U.S. Cl. ..................... 361/747; 361/726; 361/727; 361/728; 361/683; 70/208; 292/336.3
[58] Field of Search ................... 361/683, 685, 361/684, 726, 727, 732, 740, 747, 754, 728; 292/175, 145, 163, 164, 336.3; 70/208, 225; 439/152–160, 928

[56] References Cited

U.S. PATENT DOCUMENTS

| | | | |
|---|---|---|---|
| 2,609,268 | 9/1952 | Nye | 312/332.1 |
| 4,301,494 | 11/1981 | Jordan | 361/415 |
| 4,702,535 | 10/1987 | Beun | 312/308 |
| 4,931,907 | 6/1990 | Robinson et al. | 361/391 |
| 4,954,928 | 9/1990 | Jullien | 361/391 |
| 5,162,979 | 11/1992 | Anzelone et al. | 361/415 |
| 5,309,325 | 5/1994 | Dreher et al. | 361/754 |
| 5,321,962 | 6/1994 | Ferchau et al. . | |
| 5,325,263 | 6/1994 | Singer et al. . | |
| 5,434,752 | 7/1995 | Huth et al. | 361/798 |
| 5,504,656 | 4/1996 | Joist | 361/754 |
| 5,557,499 | 9/1996 | Reiter et al. | 361/685 |
| 5,586,003 | 12/1996 | Schmitt et al. | 361/683 |
| 5,600,542 | 2/1997 | Malgouires | 361/732 |
| 5,761,045 | 6/1998 | Olson et al. . | |
| 5,777,848 | 6/1998 | McAnally et al. . | |
| 5,790,372 | 8/1998 | Dewey et al. . | |
| 5,793,614 | 8/1998 | Tollbom | 361/732 |

*Primary Examiner*—Leo P. Picard
*Assistant Examiner*—Anatoly Vortman
*Attorney, Agent, or Firm*—Haynes & Boone LLP

[57] ABSTRACT

An apparatus for securing a component in a computer system. The component is mounted in the chassis of the computer system. The apparatus includes a retaining bracket connected to the chassis of the computer system and a handle connected at a first end thereof to the component. The handle has a first and a second protrusion formed at the first end and has a recess formed between the first and second protrusions. The first protrusion engages the retaining bracket at a first surface thereof to limit the component to a first insertion depth in response to the component being removably inserted into the chassis with the handle in an open position. The second protrusion engages the retaining bracket at a second surface thereof and translates the component to a second insertion depth in response to the handle being moved to a closed position. The recess is configured to establish a clearance between the recess and the retaining member during movement of the handle between the open and closed position.

20 Claims, 5 Drawing Sheets

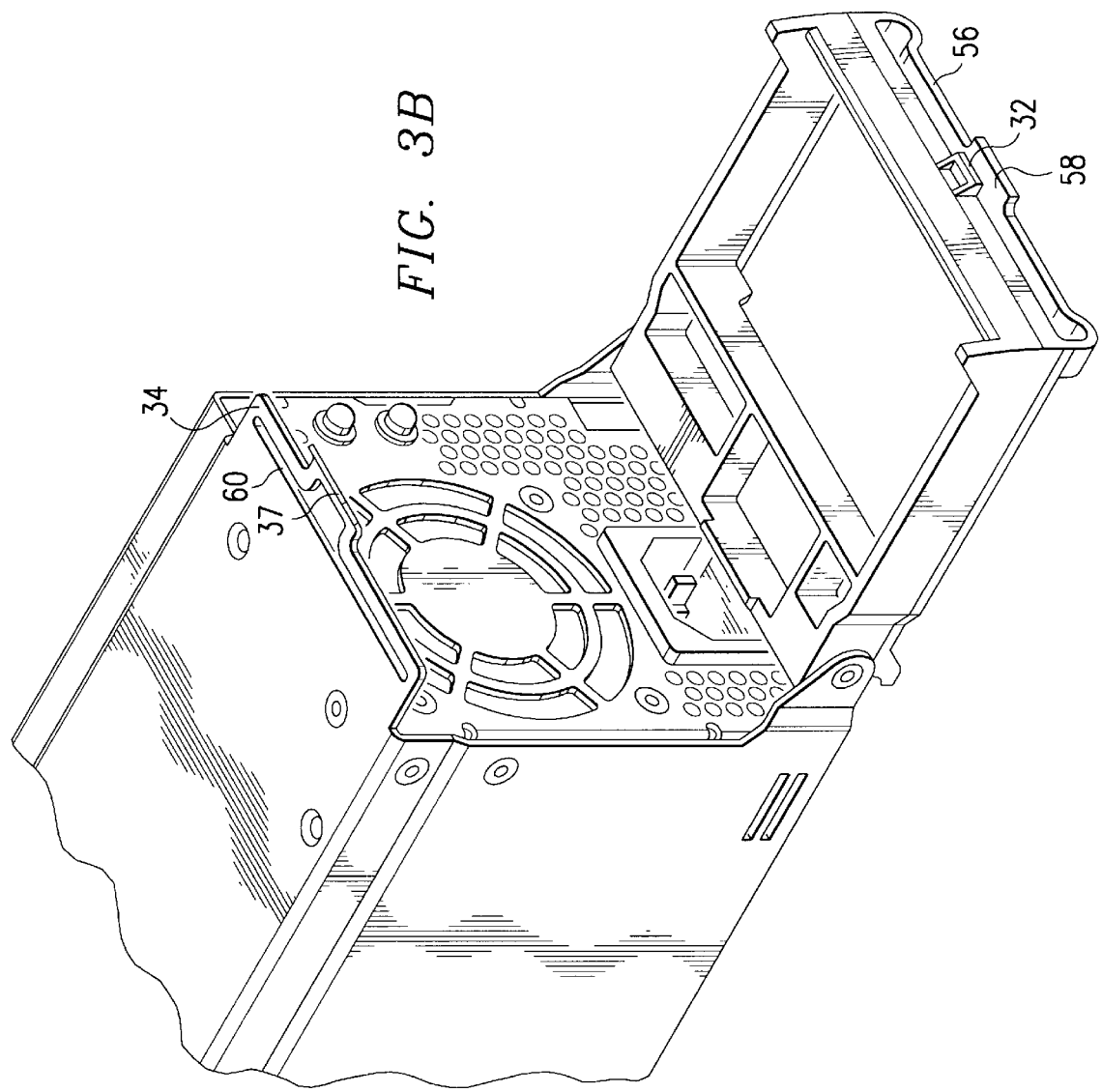

APPARATUS FOR SECURING A REMOVABLE COMPONENT IN A COMPUTER SYSTEM

BACKGROUND

The disclosures herein relate generally to computer systems and more particularly to apparatus and methods for securing removable components in a computer system.

In a computer system, various types of mounting devices may be used for securing components to the chassis or enclosure of the computer system. The components may be items such as hard drives, power supplies, or other internally mounted components. The mounting devices may also serve to aid in the component being inserted into and extracted from the chassis or enclosure of the computer system.

Mounting devices may utilize a cam-type action. The cam-type action aids in the insertion and extraction of various components of the computer system. Utilization of a cam-type action in computer systems often involves a compromise between using expensive parts or settling for less than optimal performance from the mounting device.

Accordingly, a need has arisen for an apparatus that is configured to overcome the shortcomings of prior art and in particular, a need has arisen for an apparatus that provides an effective and economical technique for securing a removable component in the chassis of a computer system and that will provide smooth operation by reducing binding and abrasion between mating surfaces of the mounting device.

SUMMARY

One embodiment, accordingly, provides an apparatus for securing removable components in a computer system. The apparatus provides for smooth operation with reduced binding and abrasion between the mating surfaces of the mounting device. To this end, one embodiment provides an apparatus for securing a component in a computer system. The component is mounted in the chassis of the computer system. The apparatus includes a retaining member connected to the chassis of the computer system and a handle connected at a first end thereof to the component. The handle has a first and a second protrusion formed at the first end and has a recess formed between the first and second protrusions. The first protrusion engages the retaining member at a first surface thereof to limit the component to a first insertion depth in response to the component being removably inserted into the chassis with the handle in an open position. The second protrusion engages the retaining member at a second surface thereof and translates the component to a second insertion depth in response to the handle being moved to a closed position. The recess is configured to establish a clearance between the recess and the retaining member during movement of the handle between the open and closed position.

Several advantages are achieved by an apparatus according to the illustrative embodiments presented herein. The apparatus will provide smooth operation and require reduced force to operate. By reducing the binding and abrasion of the mating surfaces, wear of the mating surfaces will be reduced. This simple and efficient embodiment enables the components to be made from less costly materials with reduced manufacturing steps. The apparatus is preferably configured to include a cam-type action.

BRIEF DESCRIPTION OF THE DRAWING FIGURES

FIGS. 3A and 3B are fragmentary perspective views illustrating an embodiment of a latching assembly in combination with a power supply, the handle of the latching assembly being in the open position.

DETAILED DESCRIPTION

Figure 1:
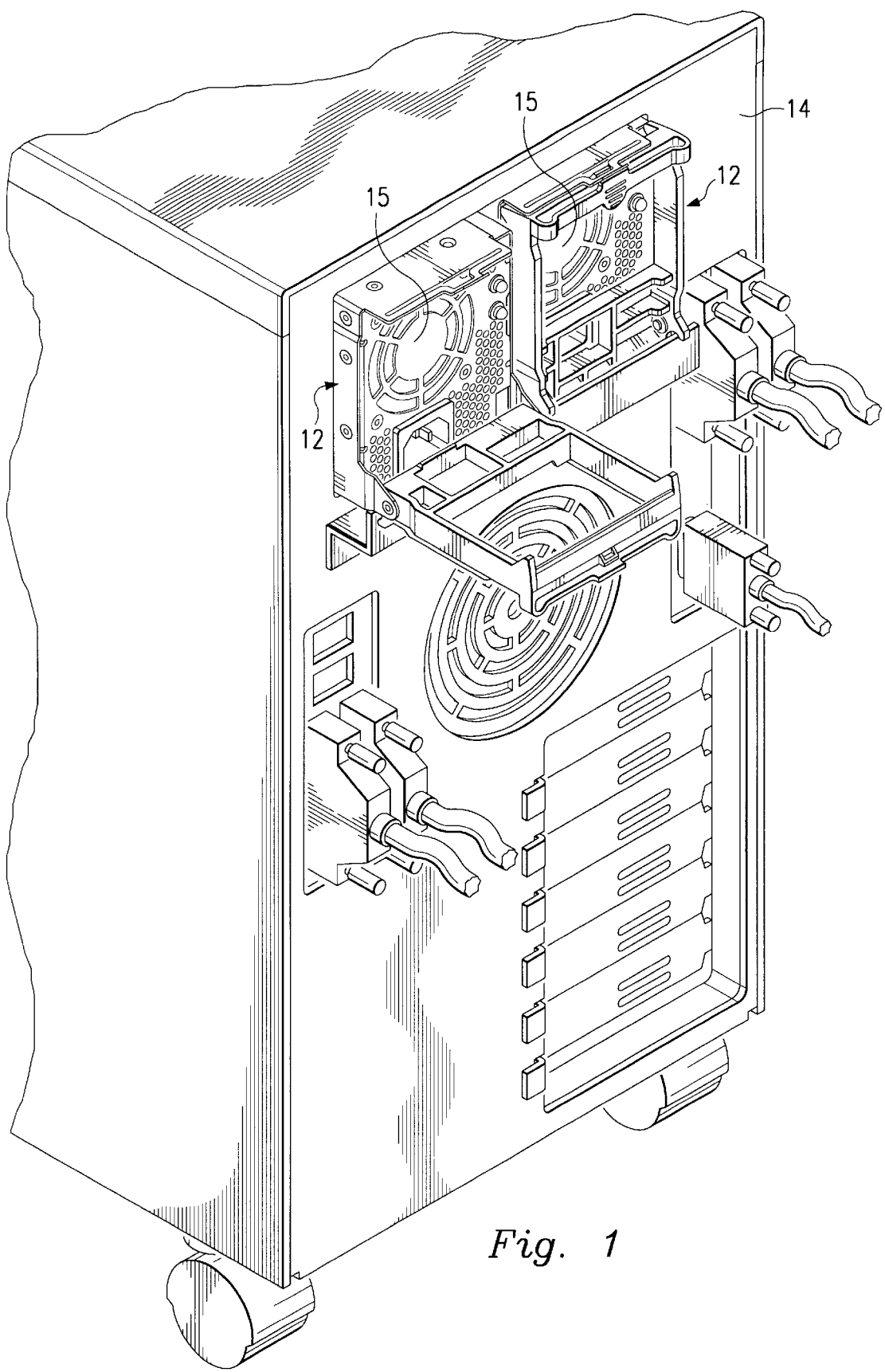
FIG. 1 is a partially fragmentary perspective view illustrating an embodiment of a computer system.
Figure 2:
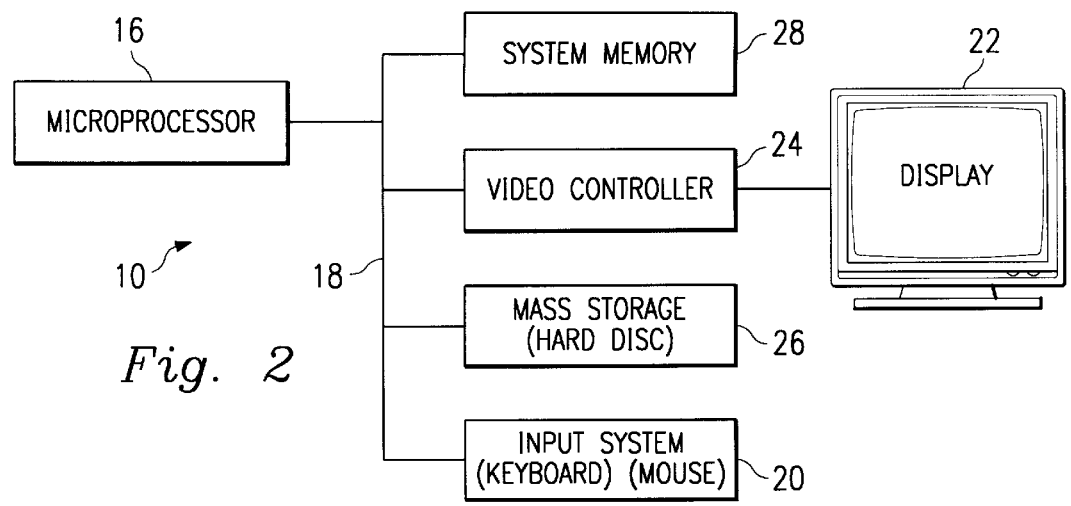
FIG. 2 is a block diagram illustrating an embodiment of a computer system.

FIGS. 1 and 2 show an illustrative embodiment of a computer system having two components 12 removably mounted in a chassis 14. The components 12 can be items such as power supplies, data storage devices, or other types of system components for a computer system. Each component 12 may include a fan vent 15 and fan (not shown) for providing air circulation through each component 12.

In the case of multiple components 12, they may be different components or the same. In host-type devices such as servers and workstations, it is sometimes desirable to have redundant components to limit down-time. One of the redundant components can be removed for servicing or replacement while the other is still in operation.

In one embodiment, as shown in FIG. 2, a computer system indicated generally at 10 includes a microprocessor 16. The microprocessor 16 is connected to a bus 18. The bus 18 serves as a connection between the microprocessor 16 and other components of the computer system 10. An input system 20 is coupled to the microprocessor 16 to provide input to the microprocessor 16. Examples of input systems include keyboards, touchscreens, and pointing devices such as a mouse, a trackball and a trackpad. The computer system 10 further includes a display 22 which is coupled to the microprocessor 16 typically by a video controller 24. Programs and data are stored on a mass storage device 26 which is coupled to the microprocessor 16. Mass storage devices include components such as hard disks, optical disks, magneto-optical drives, floppy drives, and the like. The system memory 28 provides the microprocessor 16 with fast storage to facilitate execution of computer programs by the microprocessor 16. It should be understood that other busses and intermediate circuits can be employed between the components described above and microprocessor 16 to facilitate interconnection between the components and the microprocessor.

Figure 4A:
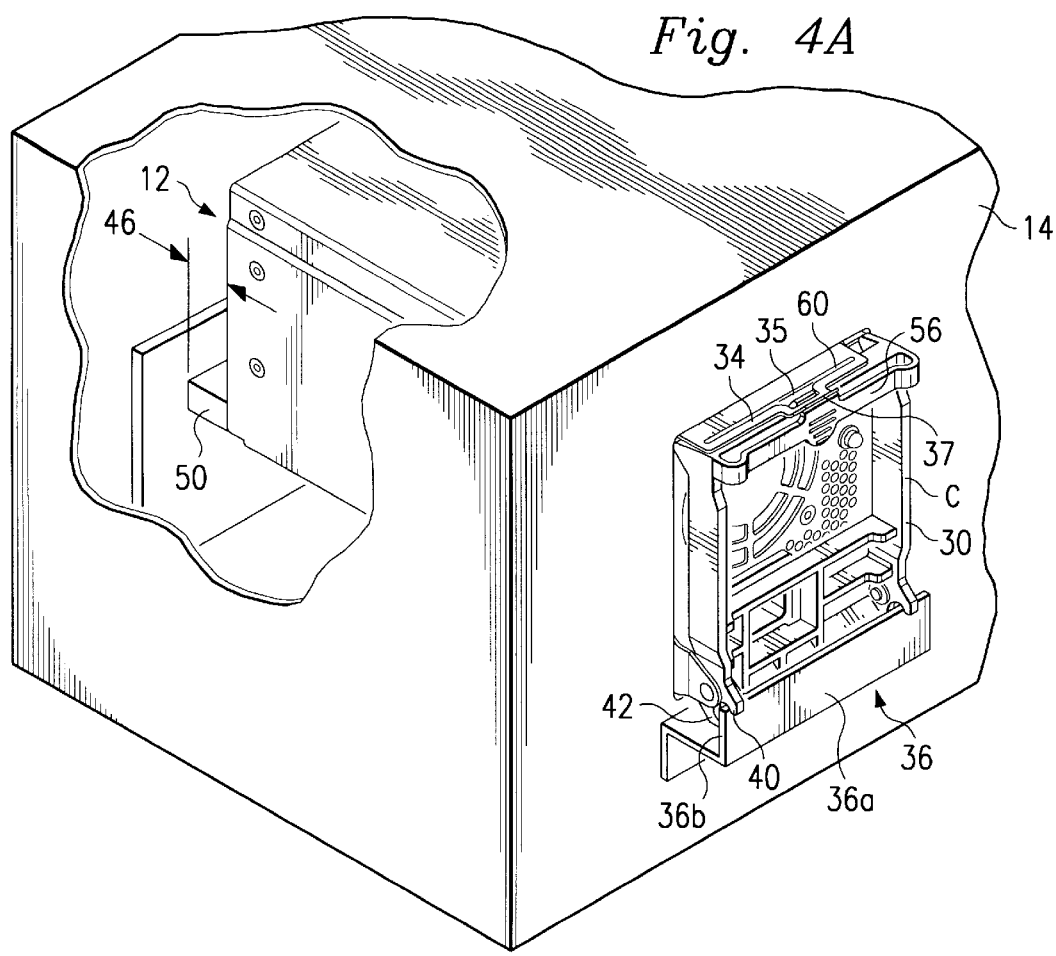
FIGS. 4A and 4B are fragmentary perspective views illustrating an embodiment of a latching assembly in combination with a power supply, the handle of the latching assembly being in the closed position.
Figure 6:
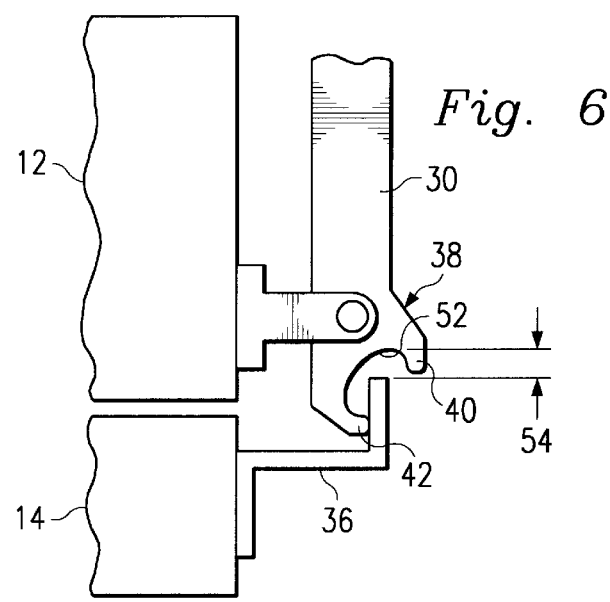
FIG. 6 is a fragmentary side view illustrating an embodiment of the retaining member.
Figure 4B:
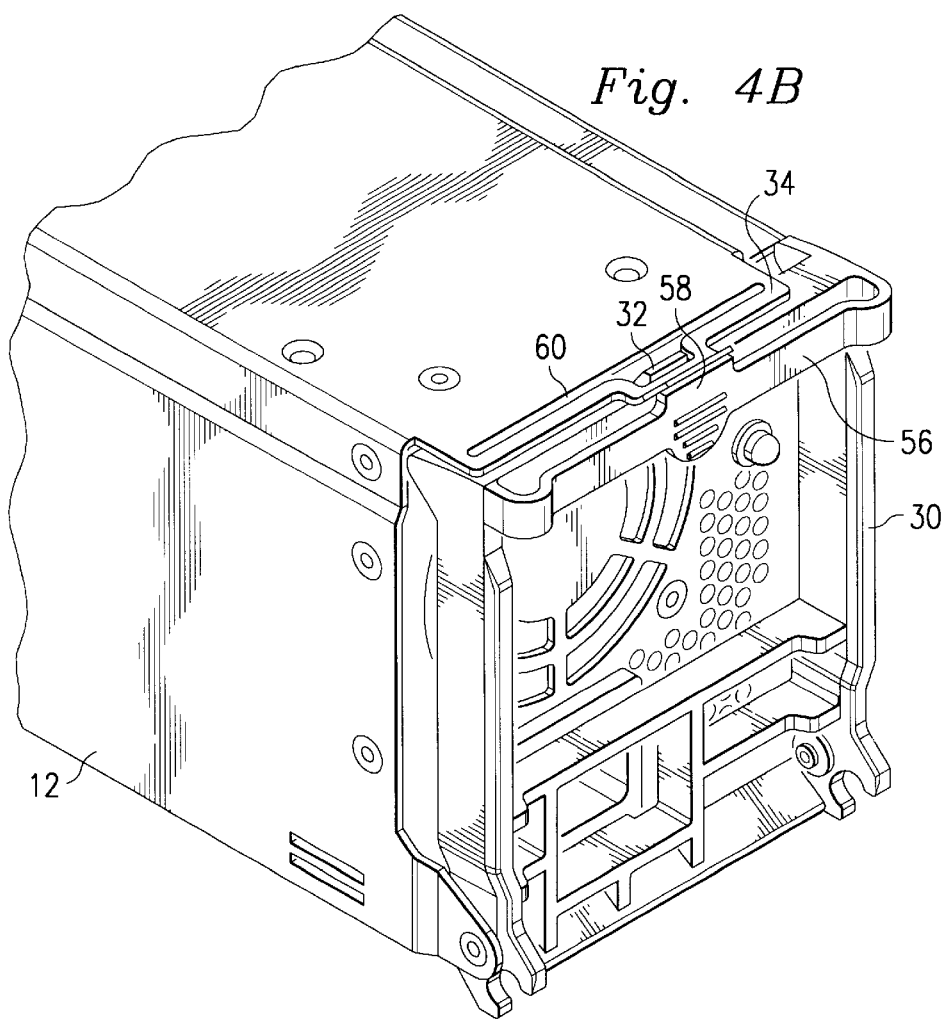
Figure 5:
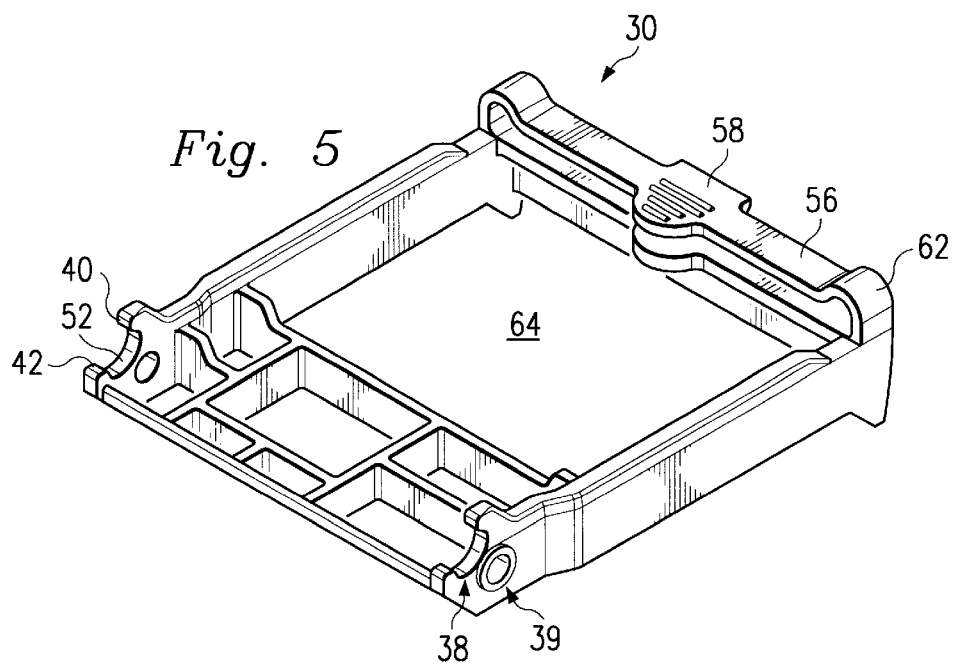
FIG. 5 is a perspective view illustrating an embodiment of a handle.

Now referring to FIGS. 5 and 6, an illustrative embodiment of a component 12 having an attached latch assembly is shown. A handle 30 includes at least one retaining member 38 at a first end 39 thereof. A retaining bracket 36 is attached to the chassis 14 and engaged by a pair of retaining members 38. As best shown in FIG. 5, each retaining member 38 includes a first protrusion 40 and a second protrusion 42. The retaining bracket 36 has a first surface 36a, FIG. 3A, that is engaged by the first protrusion 40 of each retaining member 38 and a second surface 36b, FIG. 4A, that is engaged by the second protrusion 42 of each retaining member 38.

Figure 3A:
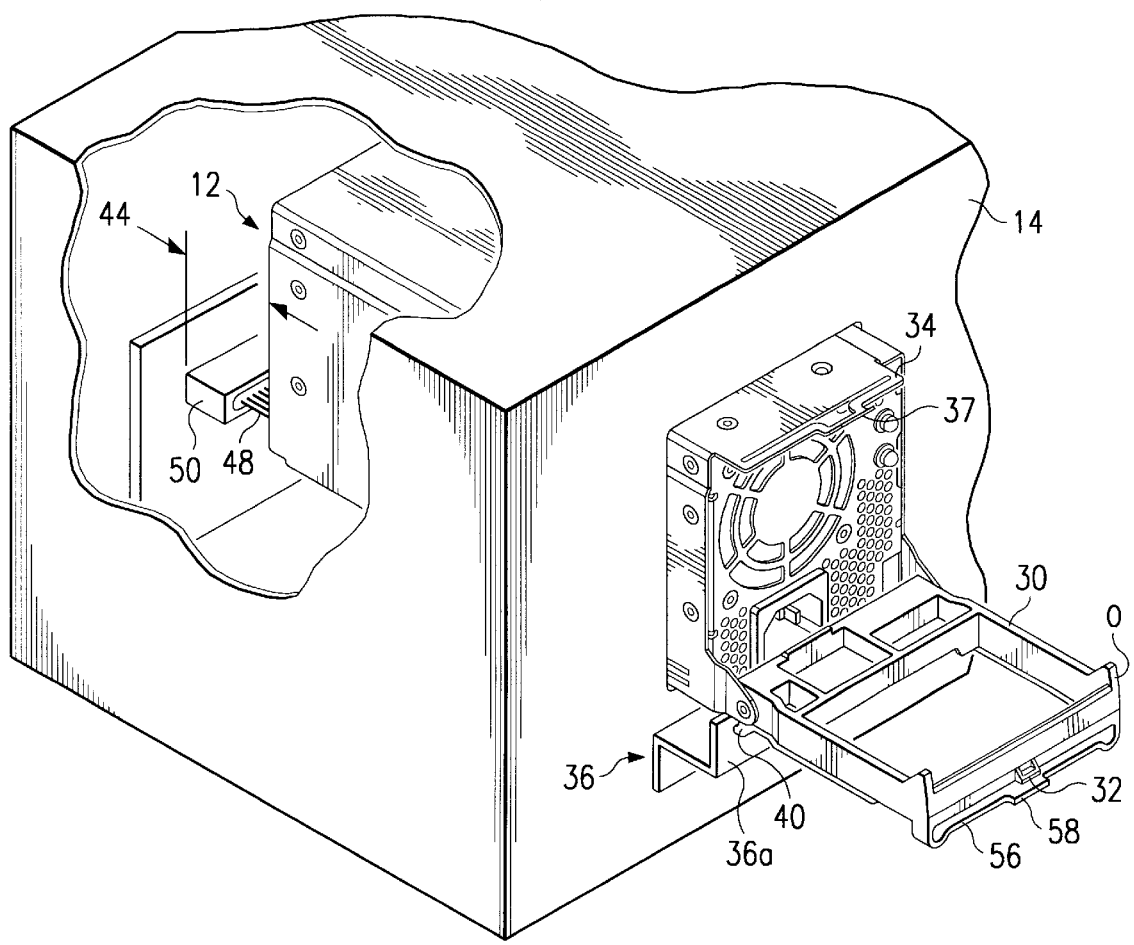

The handle 30 is movable between an open position O, FIG. 3A, and a closed position C, FIG. 4A. The handle 30, FIG. 3A, is pivotably attached to the component 12 and includes a catch 32 that is engaged by a resilient member 34 to hold the handle 30 in the closed position C. The catch 32 is captured in an opening 35, FIG. 4A, of the resilient member 34 such that the handle 30 is maintained in the closed position.

In a preferred embodiment FIG. 3A, the handle 30 is made of plastic and the retaining bracket 36 and the resilient member 34 are made of metal. In alternate embodiments, the handle 30 may be made of other materials such as metal. The handle 30 may be pivotally attached to the component 12 using rivets, threaded fasteners or other known techniques.

The component 12, FIGS. 3A and 4A, is inserted into the chassis 14 with the handle 30 in the open position O. The first protrusion 40 of each retaining member 38 engages against the first surface 36a of the retaining bracket 36. This limits the component 12 from being inserted past a first insertion depth 44, FIG. 3A. The movement of the handle 30 between the open and closed position engages the second protrusion 42 of each retaining member 38 against the second surface 36b of the retaining bracket 36. This action displaces the component 12 to a second insertion depth 46, FIG. 4A.

The dual depth insertion process reduces the potential for damage or accelerated wear of the card edge 48, FIG. 3A, and card edge connector 50. In the preferred embodiments, the first insertion depth 44 is specified such that the card edge 48 and the card edge connector 50 do not contact each other. The card edge 48 and the card edge connector 50 are brought into contact by the controlled application of force developed of the apparatus as the handle 30 is moved from the open position O to the closed position C.

The geometry of the retaining member 38, FIGS. 3A, 4A and 6 will determine the distance between the first and second insertion depths 44, 46. The distance between the first and second insertions depths 44, 46 is proportional to the distance between the first and second protrusions 40, 42. For a handle with a constant pivot location, as the distance between the first and second protrusions 40, 42 increases, so will the distance between the first and second insertion depths 44, 46.

Referring now to FIGS. 3A and 4A, the catch 32 may be disengaged from the resilient member 34 by moving the release member 56 towards the resilient member 34 until the release flange 58 engages and deflects the resilient member 34. The resilient member 34 may include an upturned tongue portion 37 for reducing binding between the release flange 58 and the resilient member. The deflection of the resilient member 34 releases the catch 32 from the opening 35. Once the catch 32 is released, the handle 30 may be moved to the open position O. The movement of the handle 30 to the open position O engages the first protrusion 40 of each retaining member 38 against the first surface 36a of the retaining bracket 36. This action displaces the component 12 to the first insertion depth 44. The component 12 may now be pulled from the chassis 14, if necessary.

As best shown in FIGS. 5 and 6, a recess 52 is formed between the first and second protrusions 40, 42. The shape of the recess 52 is preferably arcuate to minimize the stress concentrations at the regions where the protrusions 40, 42 and the recess 52 meet. More specifically, the arcuate shape is preferably an oval or a portion thereof. The recess 52 is configured to provide a clearance 54 between the recessed portion of the retaining member 38 during movement of the handle 30 between the open and closed positions. The clearance 54 precludes any binding and abrasion between the handle 30 and the retaining bracket 36 so that the handle 30 moves smoothly and with less applied force than previous techniques. This efficient feature enables the components to be made from less costly materials with simple and reduced manufacturing steps.

The resilient member 34 and the release member 56, FIG. 3A, require a degree of resiliency to perform their intended functions. Equally important is that the resiliency of the resilient member 34 and the release member 56 survive repeated flexing. As best shown in FIG. 3B and 4A, a relief 60 may be formed to provide the resilient member with suitable resiliency. The geometry of the relief 60 as well as the type and thickness of the material the relief 60 is formed through will determine the specific flexural characteristics of the resilient member 34. As best shown in FIG. 5, release member 56 may include one or more flex members 62. The flex members 62 enable the release member to deflect without over-stressing the material.

The features of the handle 30 must also take into account the air flow requirements of the component 12. It is preferred that the handle 30 have a passage 64, FIG. 5, of a sufficient size to adequately support airflow through the component 12. In addition to the size of the passage 64 in the handle 30, the presence of obstructions formed in the opening must also be considered. In the presence of significant obstructions formed in the passage 64, the power supply may fail due to overheating or operate at less than optimum conditions.

In operation, the embodiments disclosed herein provide an apparatus for securing a handle in a closed position. The handle is capable of being moved between an open and a closed position. The handle includes a catch that is fixedly engaged by a resilient member to retain the handle in the closed position. A release member is attached to the handle for releasing the resilient member from the catch. The release member is movable from a first position to a second position to deflect the resilient member whereby the resilient member is disengaged from the catch to permit the handle to be moved to the open position.

As a result, one embodiment provides an apparatus for securing a component in a computer system. The component is mounted in the chassis of the computer system. The apparatus includes a retaining member coupled to the chassis of the computer system and a handle coupled at a first end thereof to the component. The handle has a first and a second protrusion formed at the first end and has a recess formed between the first and second protrusions. The first protrusion engages the retaining member at a first surface thereof to limit the component to a first insertion depth in response to the component being removably inserted into the chassis with the handle in an open position. The second protrusion engages the retaining member at a second surface thereof and translates the component to a second insertion depth in response to the handle being moved to a closed position. The recess is configured to establish a clearance between the recess and the retaining member during movement of the handle between the open and closed position.

Another embodiment provides a computer system including a chassis, a component coupled to the chassis, a microprocessor coupled to the component, a system memory coupled to the microprocessor, a bus coupled to the microprocessor, an input device coupled to the bus and an apparatus for securing the component in the computer system. The apparatus includes a retaining member coupled to the chassis of the computer system and a handle coupled at a first end thereof to the component. The handle has a first and a second protrusion formed at the first end and has a recess formed between the first and second protrusions. The first protrusion engages the retaining member at a first surface thereof to limit the component to a first insertion depth in response to the component being removably inserted into the chassis with the handle in an open position. The second protrusion engages the retaining member at a second surface thereof and translates the component to a second insertion depth in response to the handle being moved to a closed position C. The recess is configured to establish a clearance between the recess and the retaining member during movement of the handle between the open and closed positions.

In yet another embodiment, an apparatus includes a chassis; a retaining bracket connected to the chassis; a component for being received in the chassis; and means for securing the component in the chassis connected to the component. The means includes a first portion for engaging the retaining bracket at a first surface to limit the component to a first insertion depth in response to the component being removably inserted into the chassis; a second portion for engaging the retaining bracket at a second surface to translate the component to a second insertion depth; and a recess configured to establish a clearance between the recess and the retaining bracket during movement of the component from the first insertion depth to the second insertion depth.

A still further embodiment provides a method for securing a component in a computer system. The component is mounted in the chassis of the computer system. The method includes the steps of providing a computer system having a chassis; coupling a retaining member to the chassis of the computer system; coupling a handle at a first end thereof to the component. The handle has a first and a second protrusion formed at the first end thereof and has a recess formed between the first and second protrusions. The handle is movable from an open position to a closed position. The recess is configured to continually establish a clearance between the recess and the retaining member during movement of the handle between the open and closed positions. The method further includes the steps of inserting the component into the chassis with the handle in the open position whereby the first protrusion engages the retaining member at a first surface thereof to limit the component to a first insertion depth and moving the handle from the open position to the closed position whereby the second protrusion engages the retaining member at a second surface thereof and translates the component to a second insertion depth.

As it can be seen, the illustrative embodiments presented herein provide several advantages. The apparatus will provide smooth operation and require reduced force to operate. By reducing the binding and abrasion of the mating surfaces, wear of the mating surfaces will be reduced. This simple yet efficient design enables the components to be made from less costly materials with simple or reduced manufacturing steps.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for securing a component in the chassis of a computer system comprising:

a retaining bracket connected to the chassis of the computer system;

a handle connected at a first end thereof to the component, the handle having a first and a second protrusion formed at the first end and a recess formed between the first and second protrusions, the handle having a release device at a second and thereof opposite the first end, the release device including a first member having a catch mounted thereon and a second member spaced from the first member and being flexibly movable toward the first member;

the first protrusion engaging the retaining bracket at a first surface thereof to limit the component to a first insertion depth in response to the component being removably inserted into the chassis with the handle in an open position;

the second protrusion engaging the retaining bracket at a second surface thereof and translating the component to a second insertion depth in response to the handle being moved to a closed position; and the recess being configured to establish a clearance between the recess and the retaining bracket during movement of the handle between the open position and the closed position.

2. The apparatus of claim 1 wherein the recess has an arcuate shape.

3. The apparatus of claim 2 wherein the arcuate shape is generally oval.

4. The apparatus of claim 1 wherein the handle is pivotably attached to the component.

5. The apparatus of claim 4 wherein the component is translated from the first insertion depth to the second insertion depth in response to the handle being pivoted approximately 90 degrees.

6. The apparatus of claim 1 wherein the clearance is continually provided between the open and closed positions.

7. The apparatus of claim 1 wherein the handle is formed of a polymeric material and the retaining bracket is formed of metal.

8. The apparatus of claim 1 wherein the component is electrically connected to the computer system in response to being moved from the first insertion depth to the second insertion depth.

9. A computer system comprising:

a chassis;

a microprocessor mounted in the chassis, an input coupled to provide input to the microprocessor;

a mass storage coupled to the microprocessor;

a display coupled to the microprocessor by a video controller;

a display coupled to provide storage to facilitate execution of computer programs by the microprocessor;

a component mounted in the chassis a retaining bracket connected to the chassis;

a handle connected at a first end thereof to the component, the handle having a first and a second protrusion formed at the first end and a recess formed between the first and second protrusions, the handle having a release device at a second end thereof opposite the first end, the release device including a first member having a catch mounted thereon and a second member spaced from the first member and being flexibly movable toward the first member for releasing the catch;

the first protrusion engaging the retaining bracket at a first surface thereof to limit the component to a first insertion depth in response to the component being removably inserted into the chassis with the handle in an open position;

the second protrusion engaging the retaining bracket at a second surface thereof and translating the component to a second insertion depth in response to the handle being moved to a closed position; and the recess being configured to establish a clearance between the recess and the retaining bracket during movement of the handle between the open position and the closed position.

10. The computer system of claim 9 wherein the recess has an arcuate shape.

11. The computer system of claim 10 wherein the arcuate shape is generally oval.

12. The computer system of claim 9 wherein the handle is pivotably attached to the component.

13. The computer system of claim 12 wherein the component is translated from the first insertion depth to the second insertion depth in response to the handle being pivoted approximately 90 degrees.

14. The computer system of claim 9 wherein the clearance is continually provided between the open and closed handle positions.

15. The computer system of claim 9 wherein the handle is formed of a polymeric material and the retaining bracket is formed of metal.

16. The computer system of claim 9 wherein the component is electrically connected to the computer system in response to being moved from the first insertion depth to the second insertion depth.

17. An apparatus for securing a component in a chassis comprising:

a retaining bracket connected to the chassis;

a component for being received in the chassis;

means for securing the component in the chassis connected to the component, the means including:
a resilient member extending adjacent the component:
a handle connected at a first end thereof to the component, the handle having a release device at a second end thereof opposite the first end, the release device including a first member having a catch mounted thereon and a second member spaced from the first member and being flexibly movable toward the first member for flexing the resilient member and releasing the catch;
a first portion for engaging the retaining bracket at a first surface to limit the component to a first insertion depth in response to the component being removably inserted into the chassis;
a second portion for engaging the retaining bracket at a second surface to translate the component to a second insertion depth; and
a recess being configured to establish a clearance between the recess and the retaining bracket during movement of the component from the first insertion depth to the second insertion depth.

18. A method for securing a component in the chassis of a computer system, the method comprising the steps of:

connecting a retaining bracket to the chassis of the computer system;

connecting a movable handle at a first end thereof to the component;

forming a first and a second protrusion at the first end of the handle;

forming a recess between the first and second protrusion;

forming a release device at a second end of the handle opposite the first end;

forming a first member of the release device to include a catch mounted thereon;

forming a second member of the release device spaced from the first member and being flexibly movable toward the first member;

forming an air passageway through the handle between the first end and the second end;

inserting the component into the chassis with the handle in an open position so that the first protrusion engages the retaining bracket at a first surface thereof to limit the component to a first insertion depth; and moving the handle from the open position to a closed position by engaging the second protrusion at a second surface of the retaining bracket for translating the component to second insertion depth.

19. The method of claim 18 wherein the step of connecting the handle to the component includes the step of pivotably attaching the handle.

20. The method of claim 19 wherein the step of moving the handle to the closed position includes the step of rotating the handle approximately 90 degrees.

* * * * *